(12) United States Patent
Wang et al.

(10) Patent No.: US 8,614,105 B2
(45) Date of Patent: Dec. 24, 2013

(54) PRODUCTION FLOW AND REUSABLE TESTING METHOD

(75) Inventors: Mill-Jer Wang, Hsin-Chu (TW); Ching-Nen Peng, Hsin-Chu (TW); Hung-Chih Lin, Hsin-chu (TW); Hao Chen, Luzhou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 13/247,071

(22) Filed: Sep. 28, 2011

(65) Prior Publication Data
US 2013/0078745 A1 Mar. 28, 2013

(51) Int. Cl.
*H01L 21/66* (2006.01)

(52) U.S. Cl.
USPC .................................. 438/15; 438/17; 257/48

(58) Field of Classification Search
USPC .......................... 438/15, 17; 257/48, 620, 737
See application file for complete search history.

(56) References Cited

U.S. PATENT DOCUMENTS

| | | | |
|---|---|---|---|
| 7,449,350 B2 * | 11/2008 | Pourkeramati et al. | 438/17 |
| 2004/0241914 A1 * | 12/2004 | Baldwin | 438/126 |
| 2008/0073753 A1 * | 3/2008 | Tsai et al. | 257/620 |

* cited by examiner

*Primary Examiner* — Phuc Dang
(74) *Attorney, Agent, or Firm* — Slater & Matsil, L.L.P.

(57) ABSTRACT

An embodiment is a method. The method comprises providing a substrate comprising a die area. The die area comprises sections of pad patterns, and first sections of the sections each comprise a first uniform pad pattern. The method further comprises probing a first one of the first sections with a first probe card; stepping the first probe card to a second one of the first sections; and probing the second one of the first sections with the first probe card.

25 Claims, 9 Drawing Sheets

PRODUCTION FLOW AND REUSABLE TESTING METHOD

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally given designers more freedom to package the integrated circuit dies. Various techniques have allowed dies to be stacked in different configurations. One configuration is the stacking of dies, such as in a three-dimensional (3D) package. Another is the stacking of one or more dies on an interposer, such as in a two and a half-dimensional (2.5D) package.

In the manufacturing process, various components of a package are routinely tested. In a 2.5D or 3D structure, different dies commonly are tested before stacking. The testing can be expensive and time consuming. High pin counts on the different dies can make testing using probe cards difficult.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely testing a three-dimensional integrated circuit (3DIC) structure. Other embodiments may also be applied, however, to testing any IC structure, such as a single IC structure or a two and a half dimensional IC (2.5DIC) structure. Many aspects of embodiments are discussed herein with reference to illustrations that omit some features due to those features being numerous and/or redundant to illustrated features. A person having ordinary skill in the art will readily recognize these features and understand that embodiments include these features.

Components used in 3DIC or 2.5IC structures generally have a large number of pads for signals, such as greater than 3,000 pads. For example, interposers can have front side pads that number approximately 3,600 and/or can have pads and/or bumps on a back side that number approximately 2,500. Probe cards for testing generally have pins that number much less than these components, for example, 1,024. Thus, a probe card does not generally have enough tester pins to fully contact and test these components. Embodiments generally seek to partition pads and/or bumps of a component in a uniform manner such that one probe card can be used repeatedly between partitions of the component.

Figure 1:
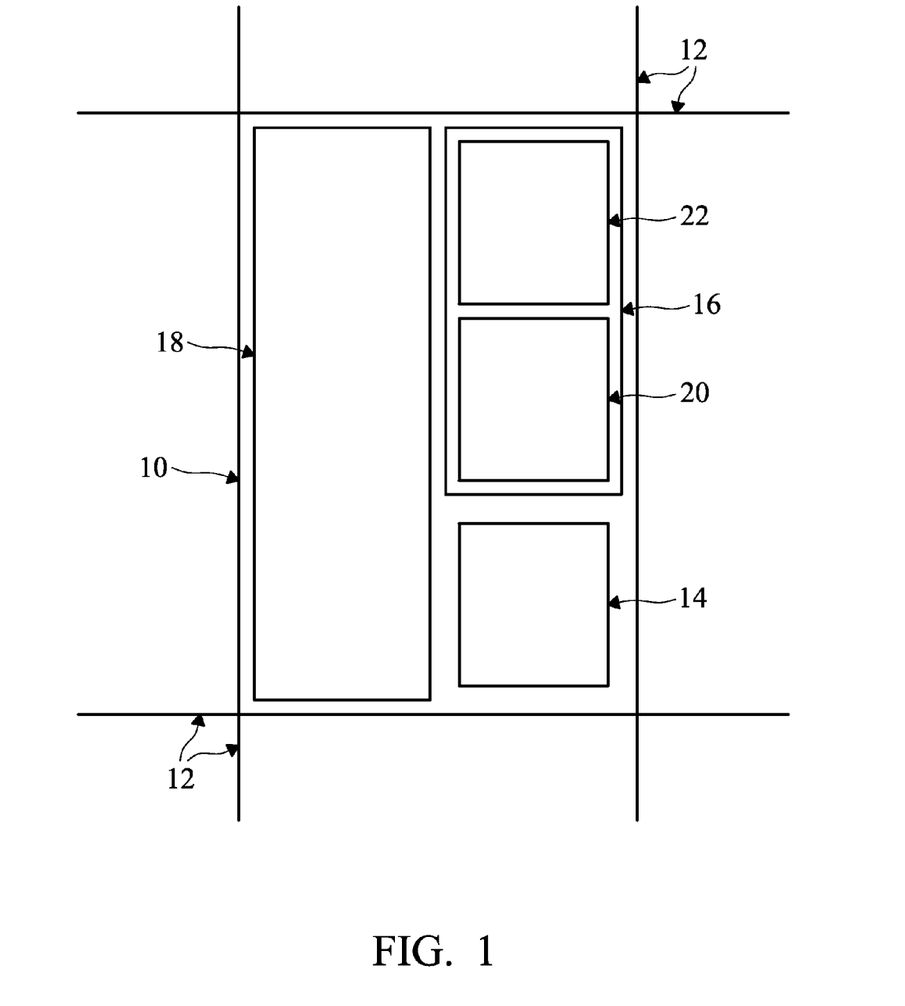
FIG. 1 illustrates aspects of a die area on an active device wafer according to an embodiment.

FIG. 1 illustrates aspects of a die area 10 on an active device wafer according to an embodiment. The die area 10 is defined by scribe lines 12. The die area 10 is divided into different blocks which may include different functionality. The die area 10 includes a first block 14, a second block 16, and a third block 18. Each block may be further divided into sections. For example, the second block 16 comprises a first section 20 and a second section 22. A section may generally be the area in which a probe card probes for testing the functionality of the die. A block may be coextensive with a single section.

Figure 2A:
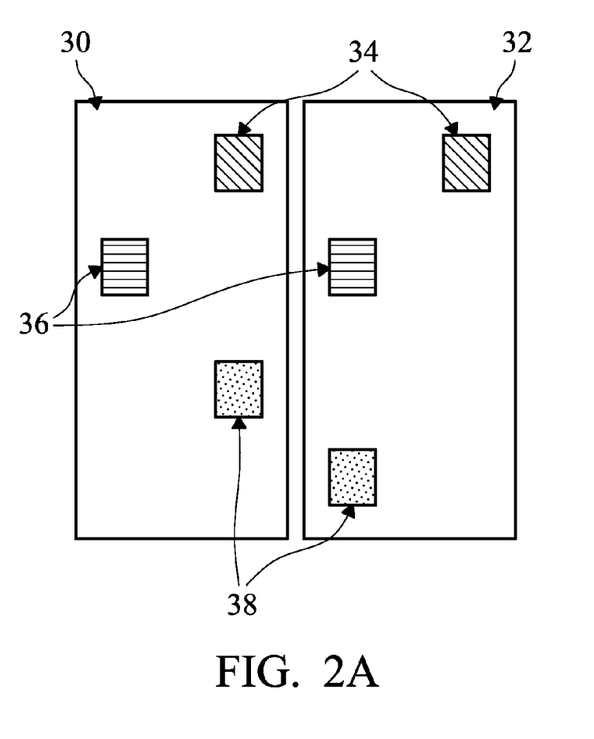
FIGS. 2A and 2B show a dummy pad insertion in sections of a die area according to an embodiment.
Figure 2B:
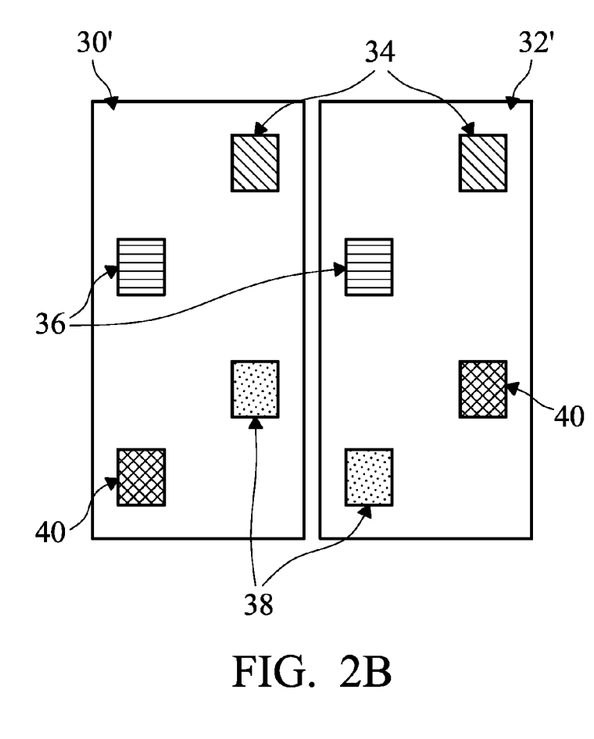

FIGS. 2A and 2B show a dummy pad insertion in sections of a die area. FIG. 2A illustrates a first section 30 and a second section 32. Each of the sections 30 and 32 comprises a power pad 34 and a ground pad 36 in corresponding locations in the sections 30 and 32. Each of the sections 30 and 32 also comprises a signal pad 38 in a different location within the sections 30 and 32. Although only one signal pad 38 is illustrated for each of the sections 30 and 32, sections may comprise many pads, some of which may have locations corresponding to pads in other sections, and some of which may have locations that do not correspond to a pad in other sections.

In FIG. 2B, a dummy pad 40 is inserted into each of the modified sections 30' and 32'. The dummy pad 40 may be electrically isolated from other features in the die area, or may be redundant to another pad in the die area. The dummy pad 40 for the modified first section 30' is inserted in a location corresponding to a signal pad 38 in the second section 32. Similarly, the dummy pad 40 for the modified second section 32' is inserted in a location corresponding to a signal pad 38 in the first section 30. By inserting the dummy pad 40 into each of the modified sections 30' and 32', the modified sections 30' and 32' have a uniform pattern of pads and/or bumps that can be probed by the same probe card during testing. In other embodiments, sections can be designed to have uniform patterns by designing the sections in such a manner to avoid using a dummy pad. It should be noted that the sections generally have a number of pads that is equal to or less than a number of pins on a probe card, such as between approximately 1,000 and approximately 2,000.

Figure 3:
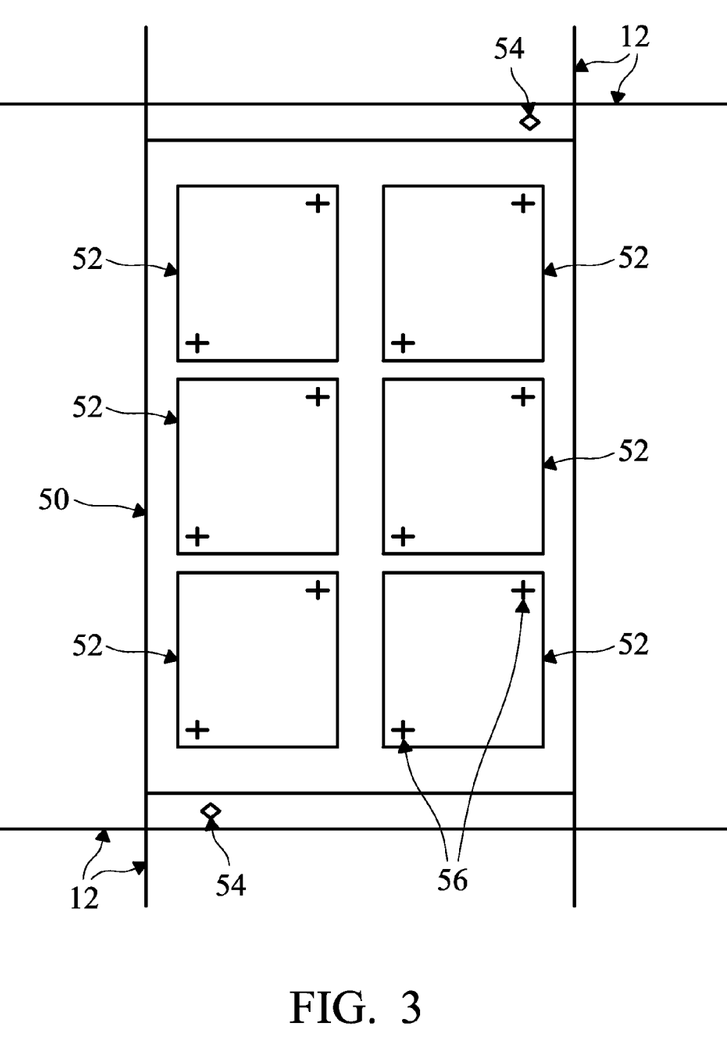
FIG. 3 is a die area modified to have uniform sections according to an embodiment.

FIG. 3 illustrates a die area 50 modified to have uniform sections 52 according to an embodiment. The die area 50 comprises six sections 52. The sections 52 have a uniform pattern of pads. The uniform pattern may be achieved by inserting a dummy pad, as discussed with respect to FIGS. 2A and 2B, or by designing the sections to have the same pattern without inserting a dummy pad. Each section 52 further comprises at least two section alignment marks 56 in respective corners of the section 52 along a diagonal of the section 52. The die area 50 further comprises at least two die alignment marks 54 near respective corners along a diagonal of the die area 50 and in or proximate to a scribe line 12.

The die area 50 of FIG. 3 allows for testing to be performed by one probe card. The probe card in an embodiment aligns with the die area 50 using the die alignment marks 54 and steps through the sections 52 using the section alignment marks 56 to probe the pads and/or bumps of each of the sections 52. Because the patterns of the sections 52 are uniform, one probe card can probe the sections to test the die. One insertion step into the testing equipment comprising the probe card is used, and six probing steps by the probe card can be used. An insertion step into testing equipment may include preheating a wafer comprising the die area to be tested at greater than 85° C., such as between approximately 105° C. and approximately 125° C., for about 10 minutes.

Figure 4:
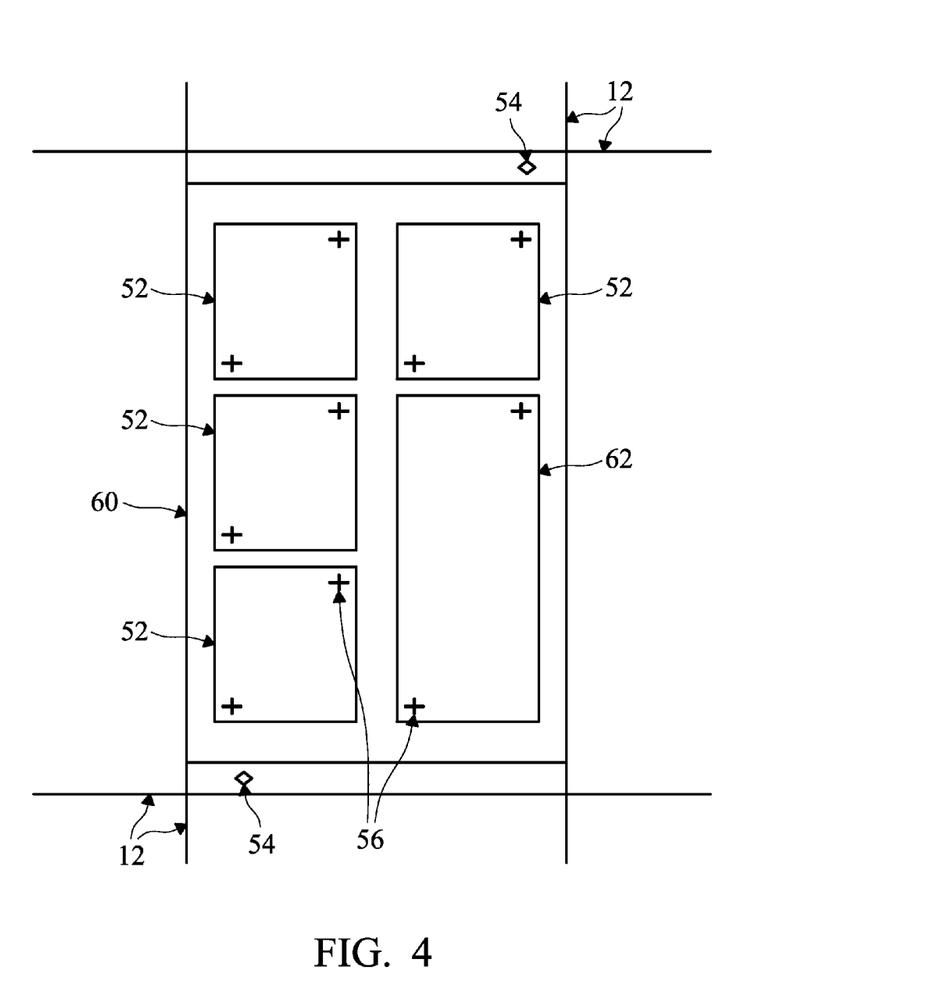
FIG. 4 is another die area comprising uniform sections and a different section according to an embodiment.

FIG. 4 is another die area 60 comprising uniform sections 52 and a different, non-uniform section 62 according to an embodiment. The die area 60 comprises four uniform sections 52 and one non-uniform section 62. The sections 52 have a uniform pattern of pads. The uniform pattern may be achieved by inserting a dummy pad, as discussed with respect to FIGS. 2A and 2B, or by designing the sections to have the same pattern without inserting a dummy pad. The non-uniform section 62 can be any pattern of pads and/or bumps.

The die area 60 of FIG. 4 allows for testing to be performed by two probe cards. A first probe card in an embodiment aligns with the die area 60 using the die alignment marks 54 and steps through the uniform sections 52 using the section alignment marks 56 to probe the pads and/or bumps of each of the sections 52. Because the patterns of the sections 52 are uniform, one probe card can probe the uniform sections 52 to test the sections. One insertion step into the testing equipment with the first probe card is used, and four probing steps by the first probe card can be used. A second probe card in the embodiment aligns with the die area 60 using the die alignment mark 54 and probes the non-uniform section 62 using the section alignment marks 56 to probe the pads and/or bumps of the section 62. A separate insertion into different testing equipment with the second probe card is used in this embodiment. Hence, a total of two insertions and two probe cards can be used.

Figure 5:
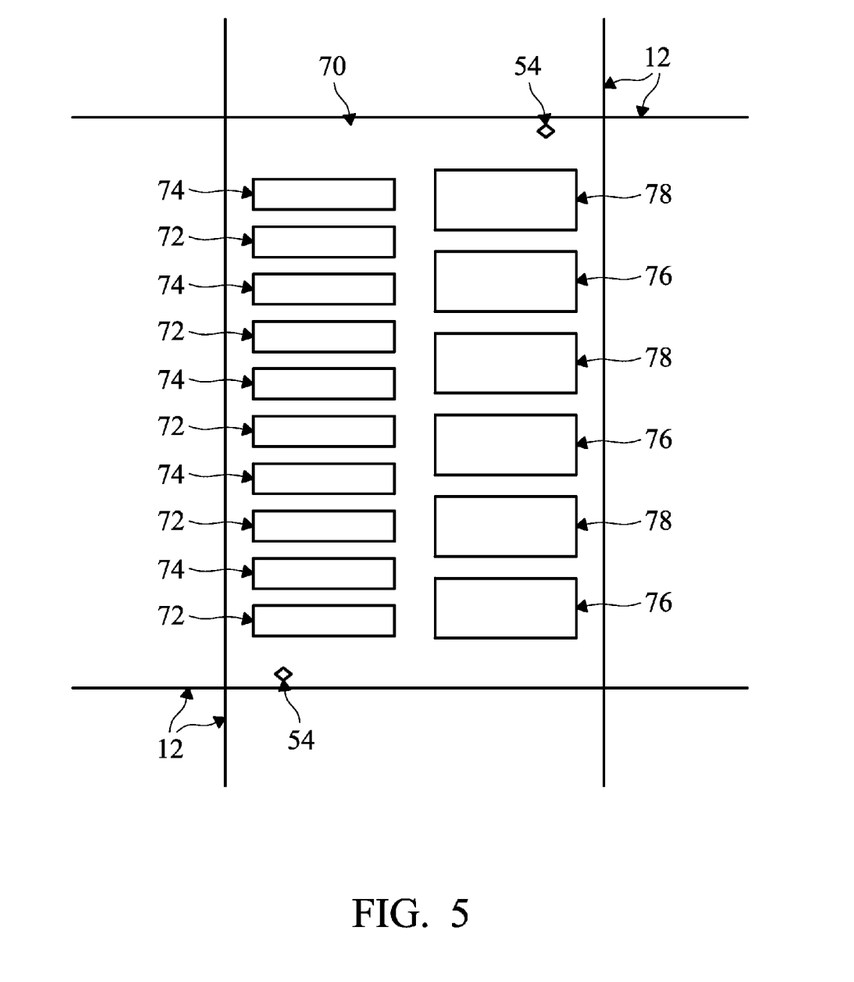
FIG. 5 is a die area comprising interlaced sections according to an embodiment.

FIG. 5 illustrates a die area 70 according to another embodiment. The die area 70 comprises first sections 72, second sections 74, third sections 76, and fourth sections 78. The first sections 72 and the second sections 74, in this embodiment, are interlaced, such as alternating within the die area 70, and have a modified uniform pad pattern, similar to the modified first section 30' and the modified second section 32', respectively, in FIG. 2B. In another embodiment, the first sections 72 and the second sections 74 are designed to have a same pad pattern without inserting a dummy pattern. The third sections 76 comprise a pad pattern different from the patterns of the first sections 72, second sections 74, and the fourth sections 78. Similarly, the fourth sections 78 comprise a pad pattern different from the patterns of the first sections 72, second sections 74, and the third sections 76. It should be noted that although not specifically depicted in FIG. 5, each of the sections 72, 74, 76, and 78 comprises section alignment marks 56 as previously shown.

Figure 6:
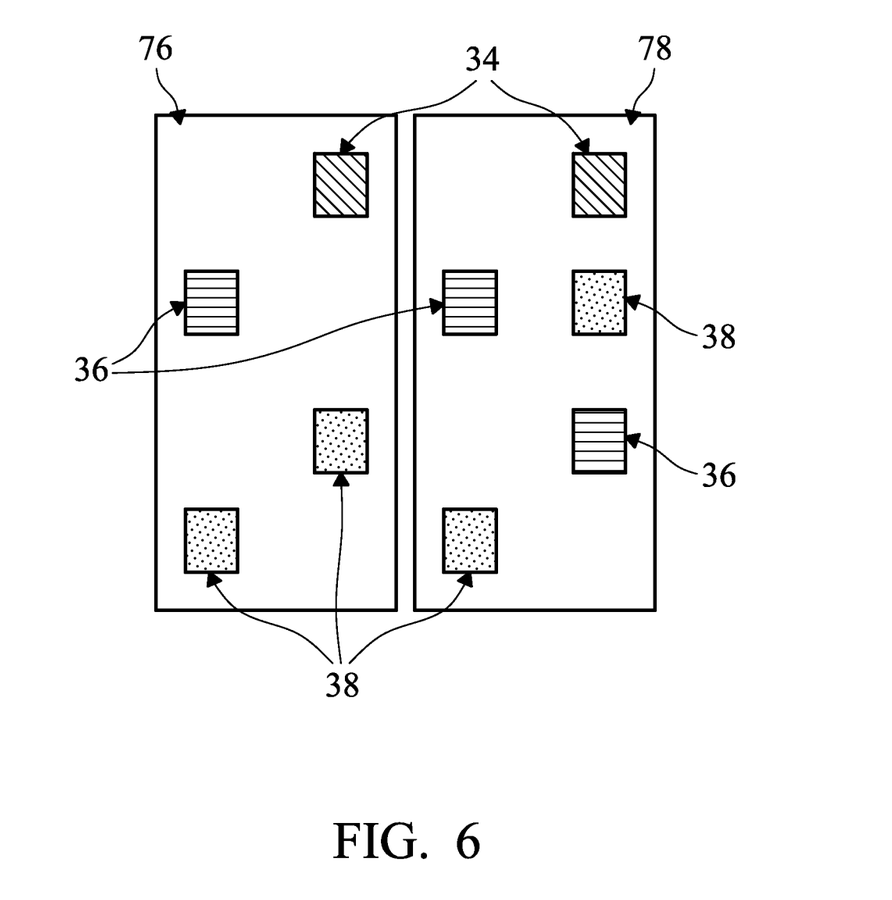
FIG. 6 is an example of different sections according to an embodiment.

An example of the third section 76 and the fourth section 78 is shown in FIG. 6, in which each of the sections 76 and 78 comprises a power pad 34, a ground pad 36, and a signal pad 38. In this embodiment, the fourth section 78 is not modified to a uniform pattern because a location of a ground pad 36 in the fourth section 78 corresponds to a location of a signal pad 38 in the third section 76. Embodiments contemplate any combination of uniform patterns used for various sections, such that repeated uniform sections are on a die area with or without non-uniform and/or different sections.

The die area 70 of FIG. 5 allows for testing to be performed by three probe cards. A first probe card in an embodiment aligns with the die area 70 using the die alignment marks 54 and steps through the first sections 72 using the section alignment marks 56 to probe the pads and/or bumps of each of the first sections 72. The first probe card steps through the second sections 74 using the section alignment marks 56 to probe the pads and/or bumps of each of the second sections 74. By the patterns of the first sections 72 and the second sections 74 being uniform, such as by modification, one probe card can probe the first sections 72 and the second sections 74 using one insertion step into the testing equipment with the first probe card. A second probe card in the embodiment aligns with the die area 70 and probes the third sections 76 using the section alignment marks 56 to probe the pads and/or bumps of the third section 76. A separate insertion into different testing equipment with the second probe card is used in this embodiment. A third probe card in the embodiment aligns with the die area 70 and probes the fourth sections 78 using the section alignment marks 56 to probe the pads and/or bumps of the fourth section 78. A separate insertion into different testing equipment with the third probe card is used in this embodiment.

In another embodiment, a first probe card aligns with the die area 70 using the die alignment marks 54 and simultaneously probes all of the first sections 72 using the pads and/or bumps of each of the first sections 72. The first probe card then can step to the second sections 74 and simultaneously probe all of the second sections 74 using the pads and/or bumps of each of the second sections 74. The second probe card can simultaneously probe all of the third sections 76 using the pads and/or bumps or each of the third sections 76, and the third probe card can simultaneously probe and the fourth sections 78 using the pads and/or bumps of each of the fourth sections 78. Hence, this embodiment can use three probe cards, three insertions, and four probing steps.

Figure 7:
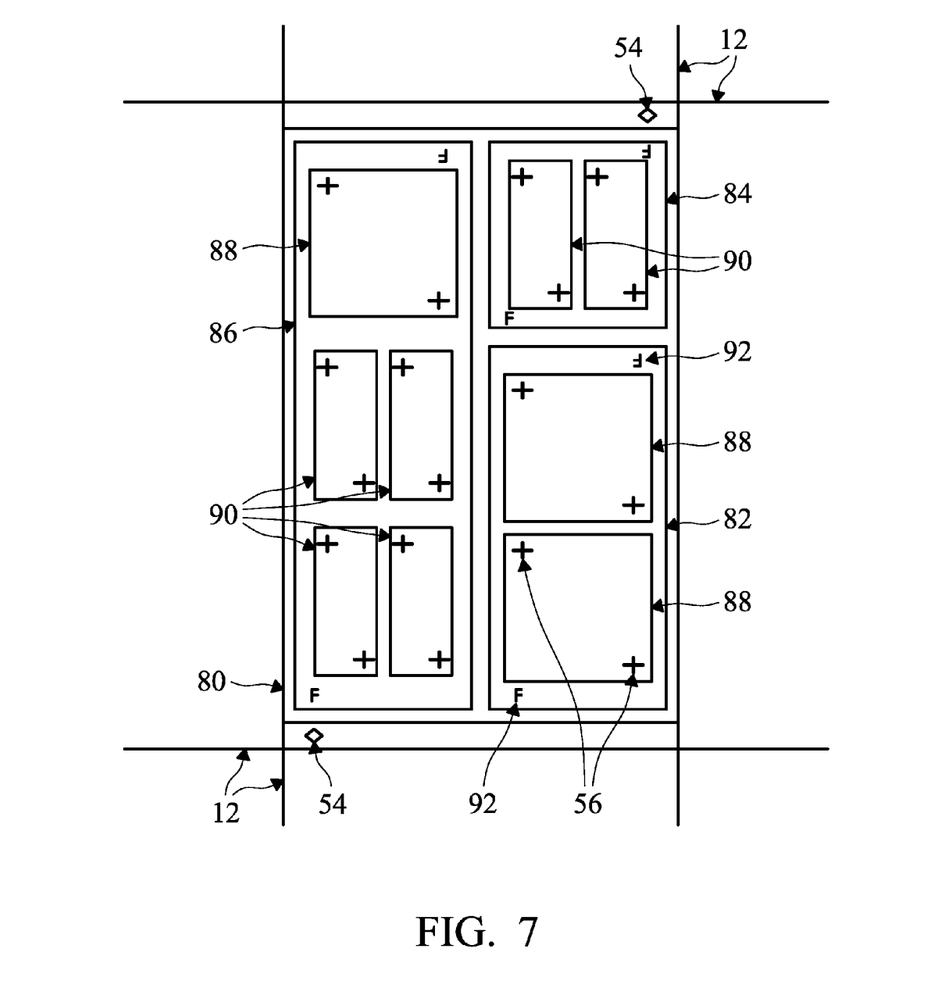
FIG. 7 is a die area of a die on a shuttle wafer according to an embodiment.

FIG. 7 is a die area 80 of a die on a shuttle wafer according to an embodiment. The die area 80 comprises a first block 82, a second block 84, and a third block 86. With the shuttle wafer design, the first block 82 can be the integrated circuitry and functionality of a first party; the second block 84 can be the integrated circuitry and functionality of a second party; and the third block 86 can be that of a third party. The blocks 82, 84, and 86 are partitioned into various sections which may be modified to have a uniform pad pattern using a dummy pad insertion or may be designed to have a uniform pad pattern without a dummy pad. The first block 82 comprises two first sections 88. The second block 84 comprises two second sections 90. The third block 86 comprises one first section 88 and four second sections 90. The first sections 88 have a uniform pattern, such as by dummy insertion or design. The second sections 90 similarly have a uniform pattern. The pattern of the first sections 88 is different from the pattern of the second sections 90. It should be noted that more sections may be present with various combinations of uniform or non-uniform patterns. The die area 80 comprises die alignment marks 54, and each of the sections 88 and 90 comprises section alignment marks 56. Each of the blocks 82, 84, and 86 comprises block alignment marks 92 in respective corners along a diagonal of the block.

The die area 80 of FIG. 7 allows for testing to be performed by two probe cards. A first probe card in an embodiment aligns with the die area 80 using the die alignment marks 54. The first probe card aligns with one of the blocks 82, 84, and 86 using the block alignment marks 92 and then aligns with a section testable by the first probe card using the section alignment marks 56. The section within the block is tested by the probe card probing the pads and/or bumps of each of the section. The probe card is then stepped to each of the sections, if any, with a same pattern within the block to probe the pads and/or bumps of those sections. Once the sections testable by the first probe pad in the block are probed, the probe card is stepped to another block and is stepped through all, if any, sections testable by the first probe card within that block. This process continues until all sections testable by the first probe pad are tested. A first insertion into test equipment with the first probe card is used for the testing of the sections testable by the first probe card. A similar process is performed to test other sections having a same pattern testable by a second probe card by using the second probe card. A second insertion into test equipment with the second probe card is used for the testing with the second probe card.

With the embodiment in FIG. 7, the wafer comprising the die area 80 is inserted into test equipment having the first probe card. The first probe card aligns with the die area 80 using the die alignment marks 54 and aligns with the first block 82 using the block alignment marks 92 of the first block 82. The first probe card aligns with one of the first sections 88 in the first block 82 using the section alignment marks 56 of the section and probes the pads and/or bumps for testing. The first probe card steps to the other one of the first sections 88 in the first block 82 using the section alignment marks 56 of the section for alignment. This first section 88 is then probed for testing. The first probe card then steps to the third block 86 using the block alignment marks 92 of the third block and also aligns with the first section 88 in the third block 86 using the section alignment marks 56. The first section 88 of the third block 86 is probed for testing. The wafer is then removed from the test equipment.

The wafer comprising the die area 80 is inserted into test equipment having the second probe card. The second probe card aligns with the die area 80 using the die alignment marks 54 and aligns with the second block 84 using the block alignment marks 92 of the second block 84. The second probe card aligns with one of the second sections 90 in the second block 84 using the section alignment marks 56 of the section and probes the pads and/or bumps for testing. The second probe card steps to the other one of the second sections 90 in the second block 84 using the section alignment marks 56 of the section for alignment. This second section 90 is then probed for testing. The second probe card then steps to the third block 86 using the block alignment marks 92 of the third block and also aligns with one of the second sections 90 in the third block 86 using the section alignment marks 56. This second section 90 of the third block 86 is probed for testing. The second probe card is stepped through the remaining second sections 90 of the third block 86 using respective section alignment marks 56 and probing these second sections 90 for testing. The wafer is then removed from the test equipment.

Figure 8:
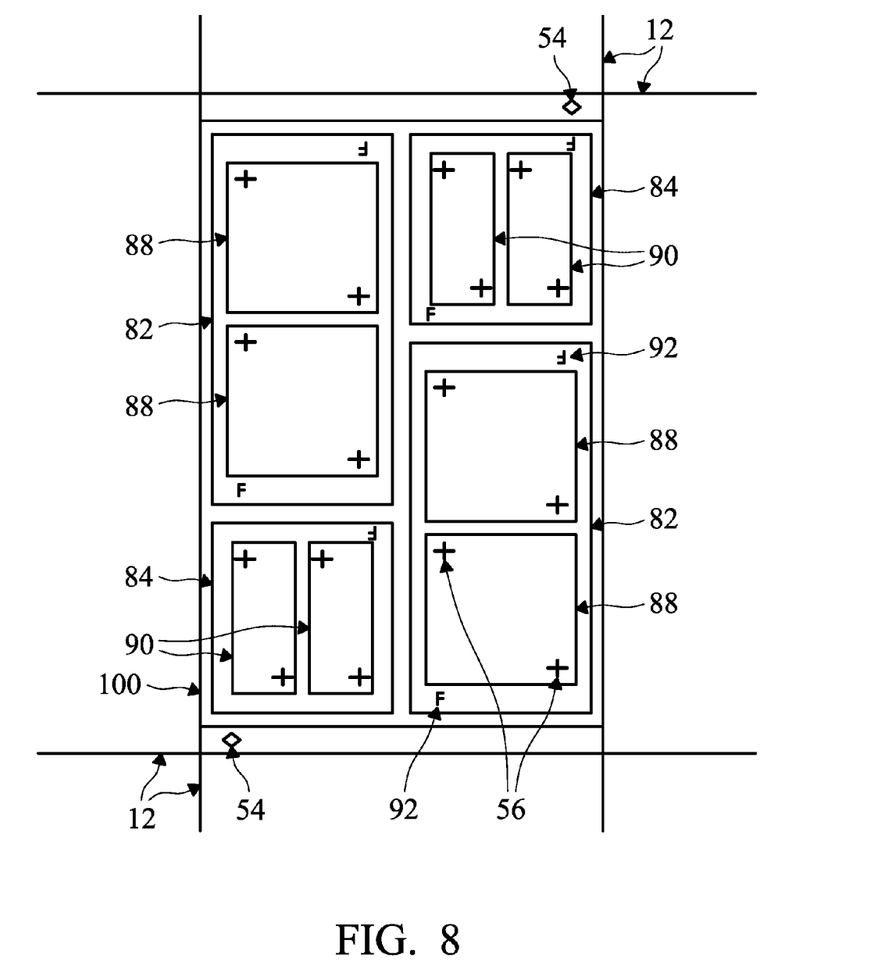
FIG. 8 is a back side substrate attach area of an interposer according to an embodiment.

Although the previous embodiments are discussed in the context of a die area on an active device wafer, other embodiments contemplate applications in the context of a die area on an interposer wafer. For example, in this embodiment, a front side die attach area of an interposer is the same or similar as the blocks and sections illustrated in FIG. 7. A back side substrate attach area 100 of an interposer is as shown in FIG. 8, such as by redistributing electrical contacts through the interposer. The substrate attach area 100 comprises two first blocks 82 with two first sections 88 each and two second blocks 84 with two second sections 90 each, as discussed with regard to FIG. 7. The first sections 88 can be probed and tested as discussed with regard to FIG. 7 using the first probe card and a first insertion, and the second sections 90 can be probed and tested similarly using the second probe card and a second insertion. The back side testing then can use two probe cards with four steps each and use two insertions. The testing of the front side (e.g., FIG. 7) and the back side (e.g., FIG. 8) of the interposer can be tested using two probe cards.

Figure 9:
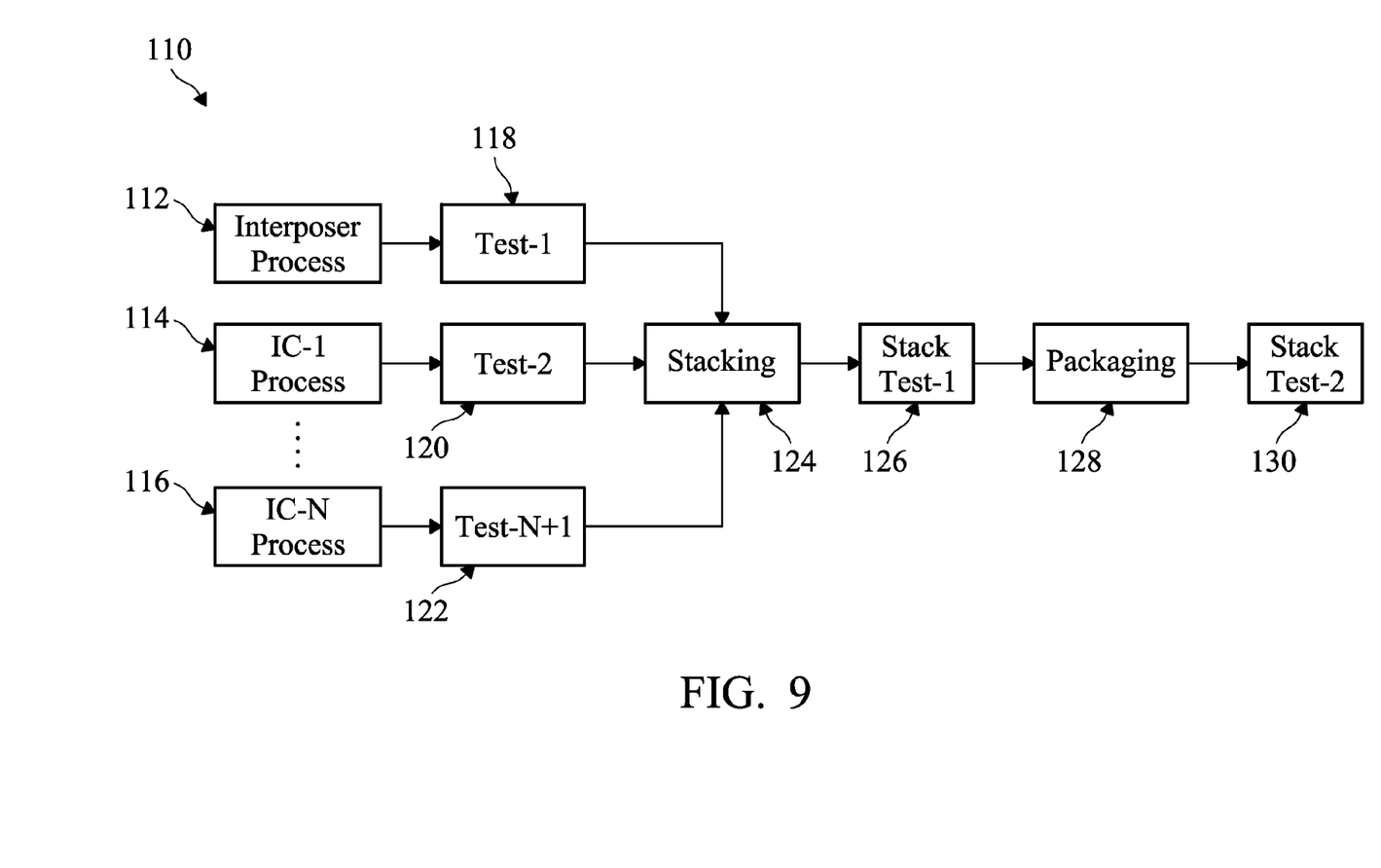
FIG. 9 is a method for testing a structure according to an embodiment.

FIG. 9 is a method 110 for testing a three-dimensional integrated circuit (3DIC) structure or two and a half dimensional IC (2.5DIC) structure according to an embodiment. In step 112, an interposer is processed according to acceptable techniques. In steps 114 and 116, N number of IC dies are processed according to acceptable techniques. Steps 112, 114, and 116 may include inserting a dummy pad or designing the interposer or dies to have uniform section patterns. In steps 118, 120, and 122, the interposer and dies are tested, such as using the probe techniques discussed in embodiments above or by using other acceptable testing techniques. Known good dies are stacked on a known good interposer in a 2.5DIC or 3DIC structure in step 124. The structure is tested in step 126 using acceptable testing techniques, such as techniques discussed above or others. The structure is then packaged such as by applying a molding compound and/or attaching a substrate in step 128. The structure is tested again in step 130 using acceptable testing techniques, such as techniques discussed above or others.

Embodiments may achieve advantages. For example, an embodiment may allow high number pad count dies and/or interposers to be tested using a reduced number of probe cards. Fewer probe cards can reduce the expense associated with producing many unique probe cards. Also, embodiments may reduce an amount of time for testing a die and/or structure. For example, an insertion step may be avoided using an embodiment which may reduce the time for testing by avoiding a heating step. Further, an embodiment can be suitable for use with a 2.5DIC or 3DIC structure.

An embodiment is a method. The method comprises providing a substrate comprising a die area. The die area comprises sections of pad patterns, and first sections of the sections each comprise a first uniform pad pattern. The method further comprises probing a first one of the first sections with a first probe card; stepping the first probe card to a second one of the first sections; and probing the second one of the first sections with the first probe card.

A further embodiment is a method. The method comprises forming a first structure in a first substrate. The first structure comprises a first die area, and the first die area has a first section and a second section. Each of the first section and the second section has a first pad pattern. The method further comprises probing the first pad pattern of the first section and of the second section using a first probe card. The first probe card steps between the first section and the second section. The method further comprises forming a second structure in a second substrate. The second structure comprises a second die area, and the second die area has a third section and a fourth section. Each of the third section and the fourth section has a second pad pattern. The method further comprises probing the second pad pattern of the third section and of the fourth section using a second probe card. The second probe card steps between the third section and the fourth section. The method also comprises attaching the first structure to the second structure.

Another embodiment is a method. The method comprises forming a first die area on a wafer. The first die area comprises a first section and a second section. The first die area comprises a dummy pad in the first section in a location of the first section corresponding to a location of a signal pad in the second section. The method further comprises aligning a first probe card to the first section; probing the first section using the first probe card; aligning the first probe card to the second section; and probing the second section using the first probe card. The method also comprises forming a second die area on a second wafer; probing the second die area; stacking the second die area on the first die area to form a stacked structure; performing a first test on the stacked structure; packaging the stacked structure to form a packaged structure; and performing a second test on the packaged structure.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing a substrate comprising a die area, the die area comprising a die alignment mark and comprising sections of pad patterns, first sections of the sections each comprising a first uniform pad pattern and comprising a section alignment mark;
   probing a first one of the first sections with a first probe card;
   stepping the first probe card to a second one of the first sections using the section alignment mark of the second one of the first sections; and
   probing the second one of the first sections with the first probe card.

2. The method of claim 1, wherein the substrate comprises a wafer comprising an active die.

3. The method of claim 1, wherein the substrate comprises a wafer comprising an interposer, the die area being on the interposer.

4. The method of claim 1, wherein the providing the substrate comprises forming the die area in the substrate, the forming the die area comprising inserting a dummy pattern into the first one of the first sections, the second one of the first sections, or a combination thereof.

5. The method of claim 1, wherein each of the sections comprises the first uniform pad pattern.

6. The method of claim 1, wherein a second section of the sections comprises a non-uniform pad pattern different from the first uniform pad pattern, and the method further comprising probing the second section with a second probe card.

7. The method of claim 1, wherein second sections of the sections each comprises a second uniform pad pattern, the first sections and the second sections being interlaced in the die area, the first probe card simultaneously probing the first sections, and the method further comprising simultaneously probing the second sections with the first probe card.

8. The method of claim 7 further comprising probing third sections of the sections with a second probe card.

9. The method of claim 1, wherein the die area comprises a first block and a second block, the first block comprising the first one of the first sections, and the second block comprising the second one of the first sections.

10. The method of claim 9, wherein each of the first block and the second block comprises a block alignment mark, the probing the first one of the first sections and the probing the second one of the first sections each comprising using the block alignment mark of the first block and the second block, respectively.

11. The method of claim 1, wherein the probing the first one of the first sections comprises using the die alignment mark and the section alignment mark of the first one of the first sections, and the stepping the first probe card to and/or the probing the second one of the first sections comprises using the die alignment mark and the section alignment mark of the second one of the first sections.

12. A method comprising:
    forming a first structure in a first substrate, the first structure comprising a first die area, the first die area having a first section and a second section, each of the first section and the second section having a first pad pattern;
    probing the first pad pattern of the first section and of the second section using a first probe card, the first probe card stepping between the first section and the second section;
    forming a second structure in a second substrate, the second structure comprising a second die area, the second die area having a third section and a fourth section, each of the third section and the fourth section having a second pad pattern;
    probing the second pad pattern of the third section and of the fourth section using a second probe card, the second probe card stepping between the third section and the fourth section; and
    attaching the first structure to the second structure.

13. The method of claim 12, wherein the first structure comprises an interposer, and the second structure comprises a die.

14. The method of claim 12, wherein the first structure comprises a first die, and the second structure comprises a second die.

15. A method comprising:
    forming a first die area on a first wafer, the first die area comprising a first section and a second section, the first die area comprising a dummy pad in the first section in a location of the first section corresponding to a location of a signal pad in the second section;
    aligning a first probe card to the first section;
    probing the first section using the first probe card;
    aligning the first probe card to the second section;
    probing the second section using the first probe card;
    forming a second die area on a second wafer;
    probing the second die area;
    stacking the second die area on the first die area to form a stacked structure;

performing a first test on the stacked structure;

packaging the stacked structure to form a packaged structure; and performing a second test on the packaged structure.

16. The method of claim 15, wherein each of the first section and the second section comprises a section alignment mark, the aligning the first probe card to the first section and to the second section comprises using the section alignment mark of the first section and the second section, respectively.

17. The method of claim 15, wherein the first die area comprises a third section, and the method further comprises:

aligning a second probe card different from the first probe card to the third section; and probing the third section using the second probe card.

18. The method of claim 15, wherein the first section comprises a plurality of first sections, and the second section comprises a plurality of second sections, the plurality of first sections being interlaced with the plurality of second sections in the first die area, the probing the first section comprising probing the plurality of first sections simultaneously, and the probing the second section comprising probing the plurality of second sections simultaneously.

19. The method of claim 15, wherein the first die area comprises a first block and a second block, the first block comprising the first section, and the second block comprising the second section.

20. The method of claim 19, wherein each of the first block and the second block comprises a block alignment mark, the aligning the first probe card to the first section and to the second section comprises using the block alignment mark of the first block and the second block, respectively.

21. A method comprising:

providing a substrate comprising a die area of a single die, the die area being circumscribed by scribe lines, the die area being defined by respective interfaces between the die area and the scribe lines, the die area comprising sections of pad patterns, first sections of the sections each comprising a first uniform pad pattern;

probing a first one of the first sections with a first probe card;

stepping the first probe card to a second one of the first sections; and probing the second one of the first sections with the first probe card.

22. The method of claim 21, wherein each of the sections comprises the first uniform pad pattern.

23. The method of claim 21, wherein a second section of the sections comprises a non-uniform pad pattern different from the first uniform pad pattern, and the method further comprising probing the second section with a second probe card.

24. The method of claim 21, wherein second sections of the sections each comprises a second uniform pad pattern, the first sections and the second sections being interlaced in the die area, the first probe card simultaneously probing the first sections, and the method further comprising simultaneously probing the second sections with the first probe card.

25. The method of claim 21 further comprising probing third sections of the sections with a second probe card.

* * * * *